United States Patent [19]
Reymond

[11] Patent Number: 5,425,649
[45] Date of Patent: Jun. 20, 1995

[54] CONNECTOR SYSTEM HAVING SWITCHING AND TESTING FUNCTIONS USING TAPERED SPRING CONTACT ELEMENTS AND ACTUATORS THEREFOR

[75] Inventor: Welles Reymond, Waterbury, Conn.

[73] Assignee: General DataComm, Inc., Middlebury, Conn.

[21] Appl. No.: 143,443

[22] Filed: Oct. 26, 1993

Related U.S. Application Data

[63] Continuation-in-part of Ser. No. 38,175, Mar. 29, 1993, Pat. No. 5,366,380, and Ser. No. 892,684, May 27, 1992, Pat. No. 5,256,073, which is a continuation of Ser. No. 605,521, Oct. 29, 1990, abandoned, and a continuation-in-part of Ser. No. 366,546, Jun. 13, 1989, Pat. No. 4,966,556.

[51] Int. Cl.$^6$ .............................................. H01R 9/09
[52] U.S. Cl. .................................... 439/189; 439/482
[58] Field of Search ................. 439/189, 188, 516, 482

[56] References Cited

U.S. PATENT DOCUMENTS

| | | | |
|---|---|---|---|
| 3,059,152 | 10/1962 | Khouri | 324/72.5 |
| 3,144,527 | 8/1964 | Tolegian | 200/51.09 |
| 3,215,968 | 11/1965 | Herrmann | 339/17 |
| 3,290,636 | 12/1966 | Overtveld | 339/17 |
| 3,404,362 | 10/1968 | Amendola | 339/17 |
| 3,407,378 | 10/1968 | Siders et al. | 339/176 |
| 3,430,182 | 2/1969 | Blanche . | |
| 3,447,249 | 6/1969 | Greger | 35/19 |
| 3,504,328 | 3/1970 | Olsson | 339/17 |
| 3,550,062 | 12/1970 | Drenten et al. . | |
| 3,601,762 | 8/1971 | Eshelman . | |

(List continued on next page.)

FOREIGN PATENT DOCUMENTS

| | | |
|---|---|---|
| 1406571 | 6/1965 | France . |
| 2742716 | 4/1979 | Germany . |
| 2806683 | 8/1979 | Germany . |
| 3441480 | 5/1986 | Germany . |
| 3500227 | 7/1986 | Germany . |
| 61-196170 | 8/1986 | Japan . |

OTHER PUBLICATIONS

"Plated Through Hole Contact," IBM Disclosure Bulletin, vol. 6, No. 16, Mar. 1964.
"Pin Pad Contacter", IBM Disclosure Bulletin vol. 17, No. 2, Jul. 1974.
"Controlled Direction Buckling Beam," IBM Disclosure Bulletin, vol. 17, No. 5, Oct. 1974.

(List continued on next page.)

*Primary Examiner*—Neil Abrams
*Attorney, Agent, or Firm*—David P. Gordon

[57] ABSTRACT

A connector system having an electrical switch capability for connecting a first electrical conductor to a second electrical conductor is provided and includes a spring biased contact element having a first portion for making electrical contact with the first electrical conductor, a second tapered contact portion for mating with a conductive rim of a hole of the second conductor, and a spring portion for biasing the tapered contact portion in the closed position where the second tapered contact portion mates with the conductive rim, and an actuation member for bringing the tapered contact portion into the open position. The actuation member may be a plunger or the like which enters the hole with which the tapered contact portion is mated from the rear side and pushes the tapered contact portion out of contact. The actuation member may have its own electrical characteristics for test purposes, and may be insulated just for opening the circuit, or appropriately insulating and conductive to form a new circuit path. The actuation member may make electrical contact with either the tapered contact portion or the conductive rim either before or after the connection between the tapered contact and the conductive rim is broken. The connector system typically connects several first conductors with several respective second conductors and allows selective switching/testing of one or more individual connections without disturbing the other connections.

17 Claims, 5 Drawing Sheets

U.S. PATENT DOCUMENTS

| | | | |
|---|---|---|---|
| 3,676,776 | 7/1972 | Bauer et al. | 339/254 |
| 3,747,045 | 7/1973 | Stross | 339/17 C |
| 3,783,433 | 1/1974 | Kurtz et al. | 339/17 C |
| 3,810,258 | 5/1974 | Mathhauser | 339/12 R |
| 3,885,215 | 5/1975 | Weinstock | 324/158 P |
| 3,899,231 | 8/1975 | Bray | 339/17 LC |
| 3,996,516 | 12/1976 | Luther | 324/158 F |
| 4,004,298 | 1/1977 | Freed . | |
| 4,009,921 | 3/1977 | Narozny . | |
| 4,012,093 | 3/1977 | Crane | 339/17 F |
| 4,037,899 | 7/1977 | Crowell | 339/17 C |
| 4,042,880 | 8/1977 | Weinstock | 324/64 |
| 4,050,769 | 8/1977 | Ammon . | |
| 4,095,867 | 6/1978 | Parks | 339/92 M |
| 4,118,090 | 10/1978 | Del Mei | 339/12 R |
| 4,164,704 | 8/1979 | Kato et al. | 324/73 PC |
| 4,175,810 | 11/1979 | Holt et al. | 339/17 C |
| 4,242,657 | 12/1980 | Chaillot | 335/207 |
| 4,245,189 | 1/1981 | Wahl et al. | 324/65 P |
| 4,270,826 | 6/1981 | Narozny | 339/75 MP |
| 4,307,928 | 12/1981 | Petlock, Jr. . | |
| 4,321,532 | 3/1982 | Luna | 324/158 F |
| 4,381,134 | 4/1983 | Anselmo et al. | 339/220 R |
| 4,417,095 | 11/1983 | Beun | 174/52 FP |
| 4,428,640 | 1/1984 | Pittman | 339/176 M |
| 4,443,756 | 4/1984 | Lightbody | 324/73 PC |
| 4,448,466 | 5/1984 | Porter | 339/17 M |
| 4,479,685 | 10/1984 | Kirby | 339/12 R |
| 4,498,722 | 2/1985 | Fedder | 339/75 MP |
| 4,504,101 | 3/1985 | Reimer | 339/17 L |
| 4,510,553 | 4/1985 | Faultersack | 361/413 |
| 4,526,429 | 7/1985 | Kirkman | 339/17 C |
| 4,528,500 | 7/1985 | Lightbody | 324/73 PC |
| 4,533,203 | 8/1985 | Feldman | 339/176 M |
| 4,541,678 | 9/1985 | Lumpp | 339/75 MP |
| 4,548,452 | 10/1985 | Gillett | 339/17 R |
| 4,550,962 | 11/1985 | Czeschka | 339/17 LC |
| 4,571,542 | 2/1986 | Arai | 324/158 P |
| 4,587,596 | 5/1986 | Bunnell | 361/398 |
| 4,606,589 | 8/1986 | Elsbree, Jr. et al. | 339/17 |
| 4,652,066 | 3/1987 | Pelzl | 339/17 LC |
| 4,663,695 | 5/1987 | Ohkawara | 361/405 |
| 4,667,270 | 5/1987 | Yagi | 361/380 |
| 4,675,600 | 6/1987 | Gergin | 324/158 P |
| 4,691,979 | 9/1987 | Manska | 439/82 |
| 4,701,703 | 10/1987 | Malloy | 324/158 F |
| 4,707,655 | 11/1987 | Krüger | 324/158 P |
| 4,717,344 | 1/1988 | Schempp et al. | 439/61 |
| 4,721,908 | 1/1988 | Driller et al. | 324/158 F |
| 4,724,383 | 2/1988 | Hart | 324/158 F |
| 4,730,086 | 3/1988 | Kamijo | 174/74 R |
| 4,735,587 | 4/1988 | Kirayoglu | 439/751 |
| 4,744,764 | 5/1988 | Rubenstein | 439/62 |
| 4,755,149 | 7/1988 | de Jong et al. | 439/248 |
| 4,758,187 | 7/1988 | Guglhor | 439/741 |
| 4,773,877 | 9/1988 | Kruger et al. | 439/482 |
| 4,789,352 | 12/1988 | Kreinberg et al. | 439/260 |
| 4,793,816 | 12/1988 | Pittman et al. | 439/79 |
| 4,793,817 | 12/1988 | Hiesbock | 439/82 |
| 4,795,362 | 1/1989 | Vonder et al. | 439/377 |
| 4,795,977 | 1/1989 | Frost et al. | 324/158 F |
| 4,806,104 | 2/1989 | Cabourne | 439/66 |
| 4,966,556 | 10/1990 | Reymond | 439/80 |
| 5,007,844 | 4/1991 | Mason | 439/68 |
| 5,215,471 | 6/1993 | Reymond et al. | 439/66 |
| 5,256,073 | 10/1993 | Reymond et al. | 439/79 |

OTHER PUBLICATIONS

"Dual-Level Printed Circuit Board Edge Connector" Research Disclosure Aug. 1987 No. 280.

Normal Force & its Measurement, Oct. 1983/1985.

IBM Technical Disclosure, Byrnes et al, vol. 7, No. 8, p. 761, Feb. 1965.

CONNECTOR SYSTEM HAVING SWITCHING AND TESTING FUNCTIONS USING TAPERED SPRING CONTACT ELEMENTS AND ACTUATORS THEREFOR

This application is a continuation-in-part of Ser. No. 08/038,175, filed Mar. 29, 1993, now U.S. Pat. No. 5,366,380 and Ser. No. 07/892,684, filed May 27, 1992, now U.S. Pat. No. 5,256,073 (which in turn is a continuation of Ser. No. 07/605,521, filed Oct. 29, 1990, now abandoned continuation-in-part of Ser. No. 07/366,546, filed Jun. 13, 1989, now U.S. Pat. No. 4,966,556) both of which are hereby incorporated by reference herein in their entireties. This application is also related to U.S. Pat. Nos. 5,160,270, and 5,215,471 which are also hereby incorporated by reference herein in their entireties.

BACKGROUND OF THE INVENTION

1. Field of the Invention

This invention relates generally to electrical switches and connectors. More particularly, the invention relates to connectors having electrical switches which utilize the coupling and uncoupling of a tapered contact element with the conductive rim of a hole for switching circuits on and off and for the connection and reconfiguration of circuits in connector systems.

2. State of the Art

The function of an electrical switch, in principle, is to complete or interrupt a circuit to allow or prevent the flow of current. Many different types of electrical switches are known in the art. Most of the known switches rely on the contact between two conductors for making an electrical connection. Depending upon the application of the particular electrical switch, the quality of connection, number of pieces required, size, and cost may vary substantially, and may have different relative importance. Regardless of the circumstances, it is most often desirable to have a small, low cost switch which provides a high quality of connection.

The function of a connector, in principle, is to provide a physical rearrangement or implementation of a plurality of possible circuits. Connectors, in general, deal with arranging inactive circuits. Typically, particular contacts of a connector cannot be opened without opening all of the contacts of a connector. Thus, it is often difficult to switch off one circuit connection in a connector setting.

Circuit board connector systems removably couple circuits on one circuit board with circuits on another circuit board or with other electronic devices. These connector systems allow for the modular design of complex circuits. A commonly used circuit board connector system is known as the "card-shelf system". In a card-shelf system, a number of parallel printed circuit boards (PCBs) mate with a common perpendicular mother board through card to mother board connectors. In many instances, it is desirable to open or close (switch) a portion of the PCB to mother board connection (inter-board connection) without unplugging the entire PCB from the mother board or while components on the PCB are otherwise still operating. In other instances, it is desirable to couple a test lead to a selected contact on either the PCB or the mother board without breaking the inter-board connection. In yet other instances, it is desirable to couple a test lead to a selected contact on either the PCB or the mother board before or after breaking the inter-board connection. Such instances include diagnostics and testing, functional programming, and configuration of the PCBs or the PCB-mother board system.

SUMMARY OF THE INVENTION

It is therefore an object of the invention to provide a connector system with an electrical switching function where the connector contacts can be coupled and uncoupled individually.

It is another object of the invention to provide a connector system where test leads can be individually coupled to individual contacts of the connector system.

It is a further object of the invention to provide a connector system for coupling a first connector with a second connector where test leads can be selectively individually coupled to an individual contact on either the first connector or the second connector while selectively maintaining the individual inter-connector contact or breaking the inter-connector contact.

It is also an object of the invention to provide a connector system for coupling circuit boards where test leads can be individually coupled to individual contacts of the connector system.

It is a yet further object of the invention to provide a connector system for coupling a first circuit board with a second circuit board where test leads can be selectively individually coupled to an individual contact on either the first circuit board or the second circuit board while selectively maintaining the individual inter-board contact or breaking the inter-board contact.

It is still another object of the invention to provide a connector system for coupling a first circuit board with a second circuit board test leads can be selectively individually coupled to an individual contact on either the first circuit board or the second circuit board while selectively breaking the individual inter-board contact either before or after the test lead is coupled.

In accord with the objects of the invention, a connector system having an electrical switch for connecting a first electrical conductor to a second electrical conductor is provided and generally comprises a spring biased contact element and an actuation means. The spring biased contact element has a first portion for making electrical contact with the first electrical conductor, a second tapered contact portion for mating with a conductive rim of a hole of the second conductor, and a spring portion for biasing the tapered contact portion in the closed position where the second tapered contact portion mates with the conductive rim. The actuation means brings the tapered contact portion into the open position and may be a plunger or the like which enters the hole with which the tapered contact portion is mated from the rear side and pushes the tapered contact portion out of contact with the hole. The actuation means may have its own electrical characteristics for test purposes. It may be insulated just for opening the circuit, or appropriately insulating and conductive to form a new circuit path. The actuation means may make electrical contact with either the tapered contact portion or the conductive rim either before or after the connection between the tapered contact and the conductive rim is broken.

3

DETAILED DESCRIPTION OF THE PREFERRED EMBODIMENTS

Figure 1:
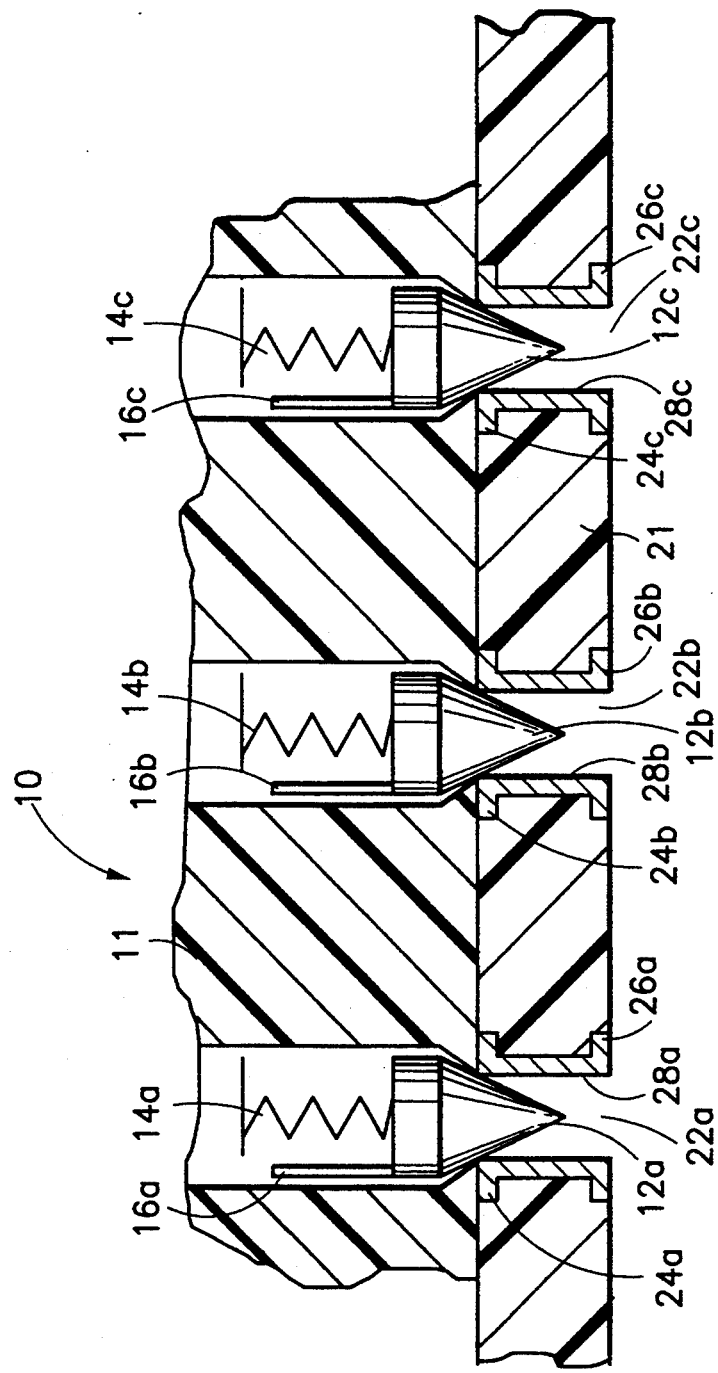
FIG. 1 is a cross sectional view illustrating a card to mother board connector system according to the invention.

Turning now to FIG. 1, a first portion of the connector system according to the invention comprises a card edge connector 10 and a mother board connector 20 which are arranged perpendicular to each other. Various details of such a connector pair are disclosed in parent application Ser. No. 07/892,684, now U.S. Pat. No. 5,5256,073. As seen in FIG. 1, card edge connector 10 includes a card 11 and a plurality of conical contact elements 12a, 12b, 12c, each of which is biased away from the edge of card 11 by a respective biasing spring 14a, 14b, 12c. Conical contact elements 12a, 12b, 12care coupled by respective leads 16a, 16b, 16c to various components (not shown) mounted on the card 11 or otherwise coupled to circuits printed on the card 11. Mother board connector 20 includes a card or board 21 having a plurality of plated through-holes 22a, 22b, 22c. Each hole 22a, 22b, 22c is provided with a respective conductive rim 24a, 24b, 24c on the side of the board 21 facing the card edge connector 10 and a respective conductive rim 26a, 26b, 26c on the opposite side of the board 21. The conductive rims are electrically coupled to each other by respective conductive sleeves 28a, 28b, 28c, lining the respective holes 22a, 22b, 22c. The conductive rims 24a, 24b, 24c, 26a, 26b, 26c are coupled by printed circuits (not shown) on board 21 to various components (not shown). Card edge connector 10 is electrically coupled to mother board connector 20 by aligning the conical contact elements 12a-12c with the holes 22a-22c and by moving the connectors 10, 20 close together until the conical contact elements 12a-12c enter the holes 22a-22c and become biased against conductive rims 24a-24c by springs 14a-12c as shown in FIG. 1. The two connectors 10, 20, once in this position, are mechanically clamped together by means not shown, but which are described in parent application Ser. No. 07/892,684, now U.S. Pat. No. 5,256,073.

Figure 2:
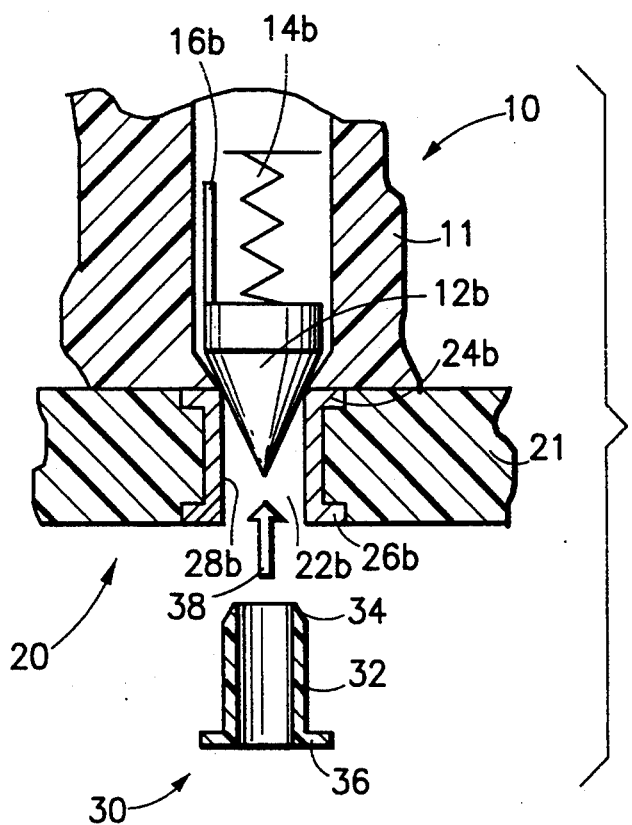
FIG. 2 is a view similar to FIG. 1 showing a selected single contact and a switching actuation means prior to insertion.
Figure 2A:
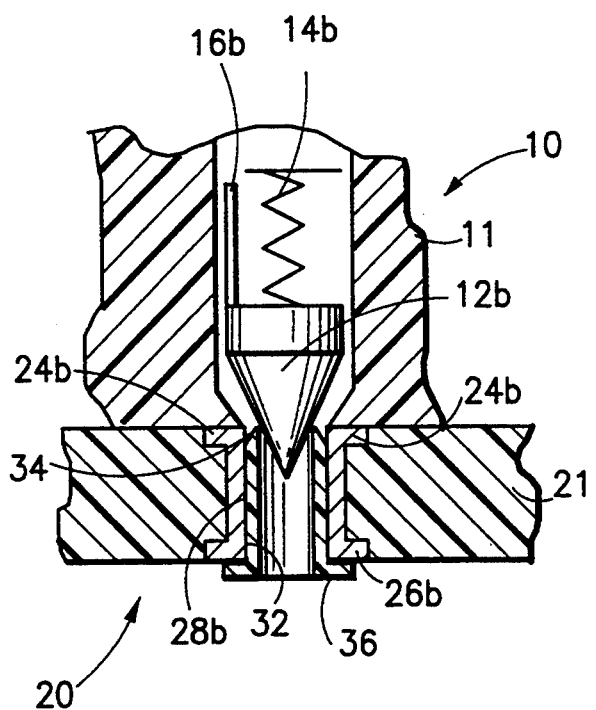
FIG. 2a is a view similar to FIG. 2 showing the switching actuation means inserted to break the selected contact between the card edge and the mother board.

In testing or reconfiguring a circuit it may be desirable to alter the connection between card edge connector 10 and mother board connector 20 by breaking one or more of the contacts between contact elements 12a-12c and respective rims 24a-24c without disturbing the other contacts. A second portion of the connector system which is designed to meet this end is shown in FIGS. 2 and 2a. Turning now to FIGS. 2 and 2a, a switching actuator 30, according to the invention, includes a non-conductive cylindrical member 32 having an upper actuating edge 34 and a lower flange 36. In order to selectively disconnect the electrical coupling between conical contact element 12b and conductive rim 24b, switching actuator 30 is inserted into hole 22b as indicated by the arrow 38 in FIG. 2 either by hand, by mechanical actuation, by electromechanical means, or other suitable means. As the actuator 30 is pressed into hole 22b, its upper edge 34 engages conical contact 12b and lifts it away from conductive rim 24b as shown in FIG. 2a. If desired, the diameter of cylinder 32 may be chosen so that when it is inserted into hole 22b as shown in FIG. 2a there is enough frictional engagement to overcome the bias of spring 14b and keep the conical contact 12b away from the conductive rim 24b until the actuator 30 is intentionally removed. In such a case, the flange 36 at the base of the actuator 30 is provided to keep the actuator from becoming irretrievably lodged in hole 22b or from inadvertently damaging contact element 12b by penetrating too deeply into hole 22b. It will be appreciated that the altitude of the cylinder 32 from the flange 36 to the actuating edge 34 is preferably such that the conical contact 12b is moved a safe distance away from conductive rim 24b when the flange 36 abuts conductive rim 26b as shown in FIG. 2a. It will be appreciated that any number of switching actuators can be inserted into various holes to break individual contacts without affecting other contacts. In fact, with electromechanical means, the switching actuator may be programmed to actuate and change the function and/or configuration of the circuit.

Figure 3:
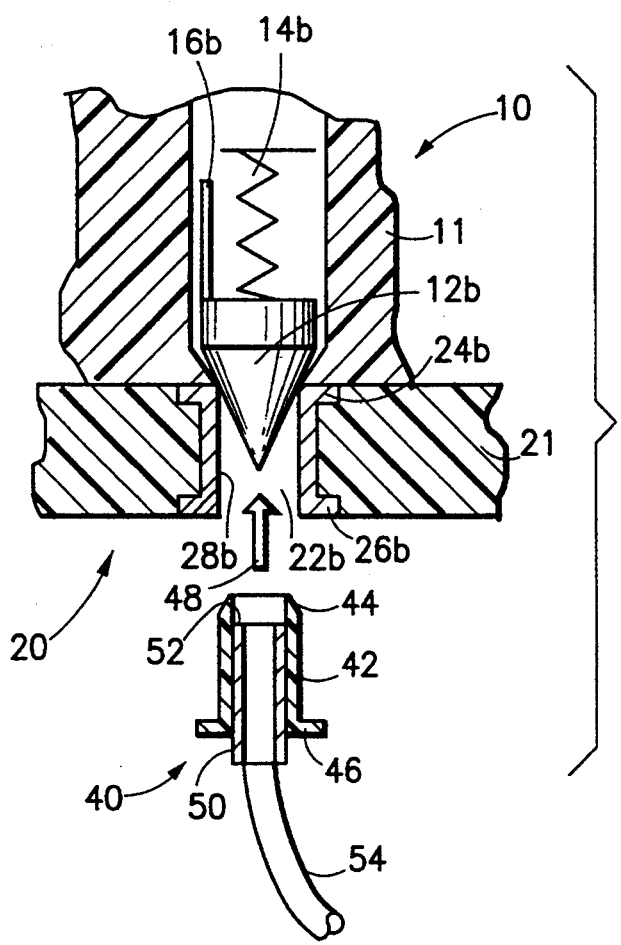
FIG. 3 is a view similar to FIG. 2 showing a first embodiment of a combination test lead connector and switching actuation means prior to insertion.
Figure 3A:
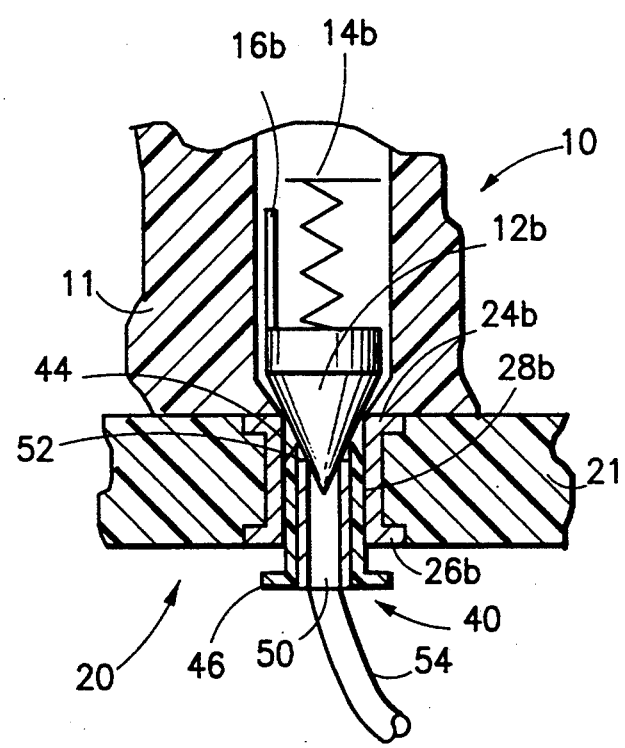
FIG. 3a is a view similar to FIG. 3 showing the first embodiment of a combination test lead connector and switching actuation means partially inserted to make contact with the card edge contact before breaking the card edge to mother board connection.

In testing or reconfiguring a circuit, it may, at other times, be desirable to connect a test lead to one or more individual contacts 12a-12c on the card edge connector 10 and subsequently disconnect the card edge contact from its respective conductive rim 24a-24c. A third portion of the connector system, which is designed to meet this end, is shown in FIGS. 3 and 3a. Turning now to FIGS. 3 and 3a, a test probe 40, according to the invention, includes a non-conductive cylindrical collar 42 having an upper edge 44 and a lower flange 46. A conductive cylinder 50 having an upper contact edge 52 and a lower wire connector 54 is slideably or otherwise inserted inside non-conductive cylindrical collar 42. This portion of the connector system operates in a manner similar to the switching actuators above with the following differences: The relative dimensions of the conductive and non-conductive parts of the test probe 40 are such that upon insertion of the probe 40 into the hole 22b as shown by arrow 48 in FIG. 3 to a first position as shown in FIG. 3a, the upper contact edge 52 of the inner conductive cylinder 50 engages the conical contact 12b before the upper edge 44 of the non-conductive collar 42 engages and lifts the conical contact 12b. Those skilled in the art will appreciate that when the probe 40 is inserted to the position as shown in FIG. 3a, the inner conductive cylinder 50 makes an electrical contact with the conical contact element 12b thereby electrically coupling the lower wire connector 54 to the contact element 12b. The lower wire connector 54 may then be coupled to various test equipment or other circuits as desired. Comparing FIGS. 2a and 3a, it will also be appreciated that the probe 40 may be further inserted into the hole 22b until the non-conductive collar 42 lifts the conical contact element out of engagement with the conductive rim 24b on the mother board 21 while maintaining the electrical coupling between inner conductive cylinder 50 and contact element 12b while the lower flange 46 of collar 42 abuts the lower conductive rim 26b of hole 22b. Additionally, it will be understood that the non-conductive collar 42 of probe 40 insulates the inner conductive cylinder 50 from electrical connection with the conductive sleeve 28b in hole 22b on the mother board 21.

Figure 4:
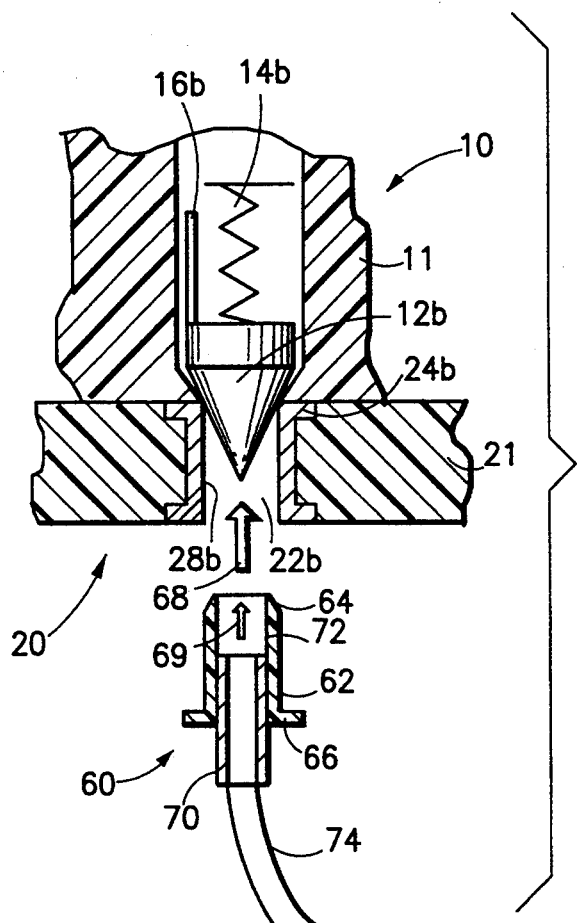
FIG. 4 is a view similar to FIG. 3 showing a second embodiment of a combination test lead connector and switching actuation means prior to insertion.
Figure 4A:
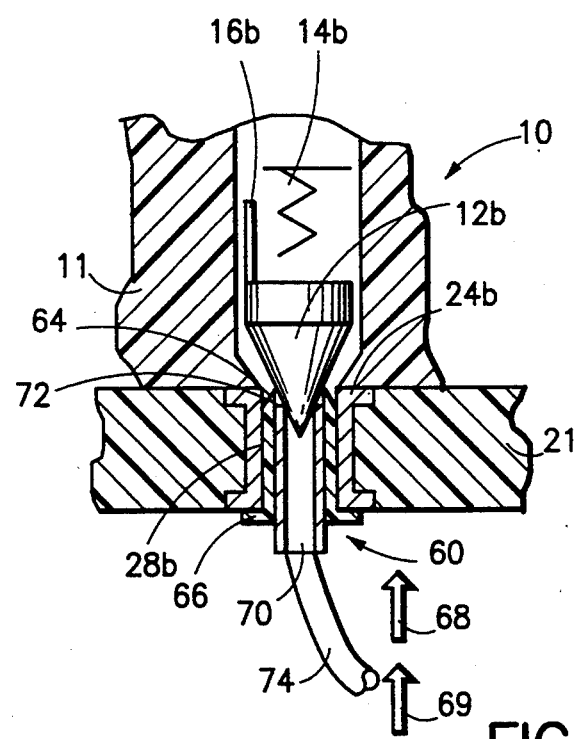
FIG. 4a is a view similar to FIG. 4 showing the second embodiment of a combination test lead connector and switching actuation means fully inserted to make contact with the card edge contact after breaking the card edge to mother board connection.

In testing or reconfiguring a circuit, it may, at other times, be desirable to connect a test lead to one or more individual contacts 12a-12c on the card edge connector 10 after first disconnecting the card edge contact from its respective conductive rim 24a-24c. A fourth portion of the connector system, which is designed to meet this end, is shown in FIGS. 4 and 4a. Turning now to FIGS. 4 and 4a, a test probe 60, according to the invention, includes a non-conductive cylindrical collar 62 having an upper edge 64 and a lower flange 66. A conductive cylinder 70 having an upper contact edge 72 and a lower wire connector 74 is slideably inserted inside non-conductive cylindrical collar 62. This portion of the connector system operates in a manner similar to the portions described above with the following differences: The relative dimensions of the conductive and non-conductive parts of the test probe 60 and the slideable relationship between them are such that upon insertion of the probe 60 into the hole 22b as shown by arrows 68 to a first position, the upper edge 62 of the inner non- conductive collar 50 engages the conical contact 12b and lifts the conical contact out of engagement with conductive rim 24b before the upper contact edge 72 of the conductive cylinder 70 engages the contact element 12b to electrically couple lower wire connector 74 with the contact element 12b. Those skilled in the art will appreciate that when the probe 60 is further inserted to the second position as shown in FIG. 4a, by sliding the inner conductive cylinder 70 in the direction shown by arrow 69 makes an electrical contact with the conical contact element 12b thereby electrically coupling the lower wire connector 54 to the contact element 12b. The lower wire connector 54 may then be coupled to various test equipment or other circuits as desired.

Figure 5:
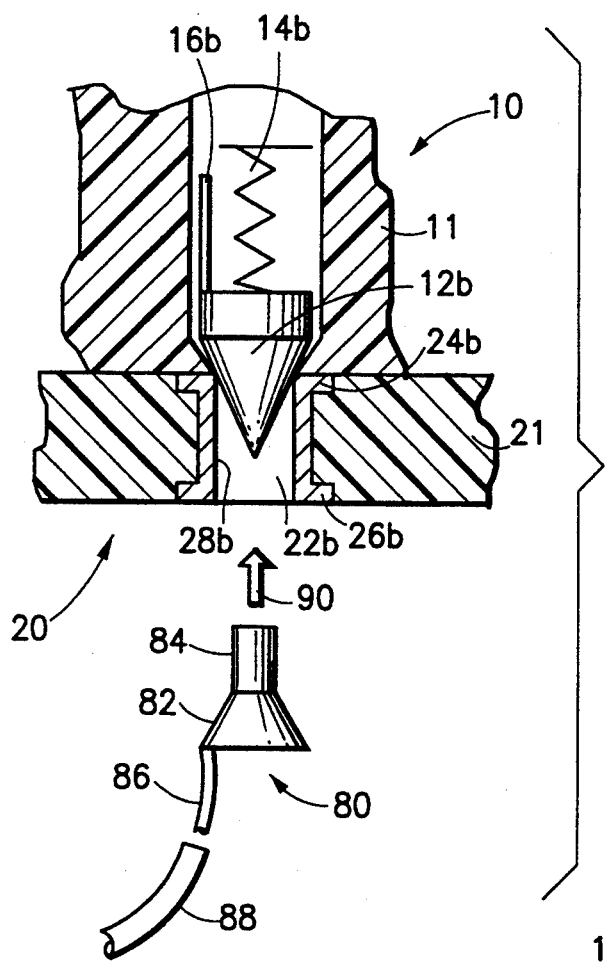
FIG. 5 is a view similar to FIG. 4 showing a third embodiment of a combination test lead connector and switching actuation means prior to insertion.
Figure 5A:
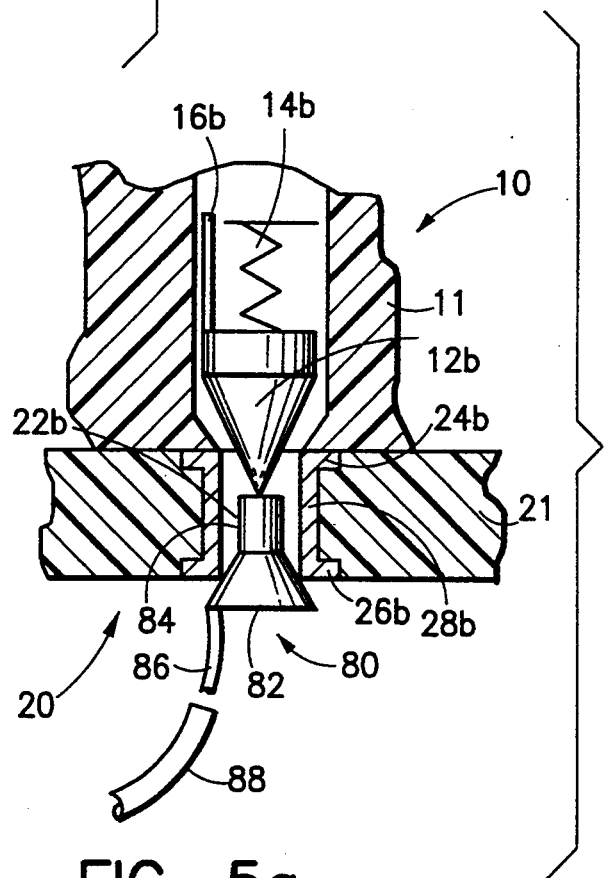
FIG. 5a is a view similar to FIG. 5 showing the third embodiment of a combination test lead connector and switching actuation means fully inserted to make contact with the mother board contact after breaking the card edge to mother board connection.

In testing or reconfiguring a circuit, it may, at other times, be desirable to connect a test lead to one or more individual contacts (lower conductive rims) 26a-26c on the mother board connector 20 after first disconnecting the card edge contact 12a-12c from its respective conductive rim 24a-24c. A fifth portion of the connector system, which is designed to meet this end, is shown in FIGS. 5 and 5a. Turning now to FIGS. 5 and 5a, a test probe 80, according to the invention, includes a conductive conical contact element 82 with a non-conductive cylindrical extension 84. Conductive contact element 82 is electrically coupled to a lower wire connector 86 which is coupled to a test lead 88. Probe 80 is inserted into hole 22b as shown by the arrow 90 in FIG. 5 to the position shown in FIG. 5a. As seen in FIG. 5a, the upper non-conductive cylindrical extension first engages the contact element 12b and lifts it away from conductive rim 24b before the contact element 82 engages and electrically couples with lower conductive rim 26b on mother board 21.

There have been described and illustrated herein different embodiments of an electrical connector which utilize the mating and decoupling of tapered contact elements with the conductive rims of holes for switching circuits on and off and for the connecting and testing of circuits. While particular embodiments of the invention have been described, it is not intended that the invention be limited thereby, as it is intended that the invention be broad in scope and that the specifications be read likewise. Thus, while particular geometries of contact elements were shown and described, it will be appreciated that the contact elements may take many shapes and forms, including, but not limited to those described in the parent applications hereto, and the related co-assigned U.S. Patents previously incorporated by reference herein. Similarly, while particular switch and probe configurations were described, it will be appreciated that numerous other switch and probe configurations can be utilized in conjunction with the general concept of the invention of mating of a tapered contact portion to a conductive rim of a hole. For example, the switch/probe connector function of the invention could be between parallel or perpendicular PCBs, between a PGA packaged LSI and its base card as described in parent application Ser. No. 08/038,175, between a cable connector and PCB, or between two cable connectors. Also, while the cylindrical portions of the probes/actuators have been shown as hollow, it will be appreciated that in many instances, solid cylindrical portions could be used. Further, while double sided boards with plated through holes have been shown in the Figures, those skilled in the art will appreciate that the invention also applies to single sided boards with through holes having conductive rims on one side only. Therefore, it will be apparent to those skilled in the art that other changes and modifications may be made to the invention as described in the specification without departing from the spirit and scope of the invention as so claimed.

We claim:

1. An electrical connector system for coupling a first connector having a plurality of first electrical contact elements with a second connector having a plurality of second electrical contact elements including means for selectively uncoupling individual first contact elements from individual second contact elements, said connector system comprising:

a) a first connector having a plurality of spring biased first contact elements each having a tapered contact area;
   b) a second connector having a plurality of holes each having a front end and a rear end with a conductive rim around said front end, each of said conductive rims forming one of said second contact elements; said plurality of spring biased first contact elements being arranged on said first connector such that when said first connector and said second connector are brought into aligned proximity each of said tapered contact areas of said plurality of spring biased first contact elements enters a respective one of said plurality of holes in said second connector through said front ends of said holes and engages a respective one of said conductive rims; and c) a non-conductive switching actuator removably insertable in one of said plurality of holes through said rear end of said hole to selectively disengage one of said tapered contact areas from a respective conductive rim by moving said one of said tapered contact areas axially relative to said hole.

2. A connector system according to claim 1, wherein:
said first connector comprises a printed circuit board card and said plurality of spring biased first contact elements are arranged along an edge of said card.

3. A connector system according to claim 1, wherein:
said tapered contact area is conical.

4. A connector system according to claim 2, wherein:
said second connector comprises a board and when said first and second connector are brought into aligned proximity said card and said board are substantially perpendicular to each other.

5. A connector system according to claim 1, wherein:
each of said holes has a second conductive rim on said rear end thereof and each conductive rim is electrically coupled with a corresponding second conductive rim.

6. A connector system according to claim 1, wherein:
said non-conductive switching actuator is a cylindrical member.

7. A connector system according to claim 6, wherein:
said non-conductive switching actuator frictionally engages one of said plurality of holes and includes a flanged end to prevent it from passing through one of said plurality of holes.

8. A connector system according to claim 6, wherein:
said cylindrical member is hollow.

9. An electrical connector system for coupling a first connector having a plurality of first electrical contact elements with a second connector having a plurality of second electrical contact elements including means for selectively uncoupling individual first contact elements from individual second contact elements, said connector system comprising:

a) a first connector having a plurality of spring biased first contact elements each having a tapered contact area;

b) a second connector having a plurality of holes each having a front end and a rear end with a conductive rim around said front end, each of said conductive rims forming one of said second contact elements; said plurality of spring biased first contact elements being arranged on said first connector such that when said first connector and said second connector are brought into aligned proximity each of said tapered contact areas of said plurality of spring biased first contact elements enters a respective one of said plurality of holes in said second connector through said front ends of said holes and engages a respective one of said conductive rims; and c) a non-conductive switching actuator removably insertable in one of said plurality of holes through said rear end of said hole to selectively disengage one of said tapered contact areas from a respective conductive rim, wherein
said non-conductive switching actuator includes an inner conductive member for contacting a respective one of said tapered contact areas.

10. A connector system according to claim 9, wherein:
said non-conductive switching actuator is a cylindrical member.

11. A connector system according to claim 10, wherein:
said cylindrical member and said inner conductive member are arranged such that said inner conductive member contacts one of said tapered contact areas after said cylindrical member disengages said one of said tapered contacts from its respective conductive rim.

12. A connector system according to claim 10, wherein:
said cylindrical member and said inner conductive member are arranged such that said inner conductive member contacts one of said tapered contact areas before said cylindrical member disengages said one of said tapered contacts from its respective conductive rim.

13. A connector system according to claim 11, wherein:
said cylindrical member has an upper engaging edge, said inner conductive member comprises a conductive cylinder with an upper conductive edge, and said inner conductive cylinder is mounted inside said cylindrical member with its upper conductive edge below said upper engaging edge of said cylindrical member.

14. A connector system according to claim 12, wherein:
said cylindrical member has an upper engaging edge, said inner conductive member comprises a conductive cylinder with an upper conductive edge, and said inner conductive cylinder is slideably mounted inside said cylindrical member.

15. An electrical connector system for coupling a first connector having a plurality of first electrical contact elements with a second connector having a plurality of second electrical contact elements including means for selectively uncoupling individual first contact elements from individual second contact elements, said connector system comprising:

a) a first connector having a plurality of spring biased first contact elements each having a tapered contact area;

b) a second connector having a plurality of holes each having a front end and a rear end with a conductive rim around said front end, each of said conductive rims forming one of said second contact elements; said plurality of spring biased first contact elements being arranged on said first connector such that when said first connector and said second connector are brought into aligned proximity each of said tapered contact areas of said plurality of spring biased first contact elements enters a respective one of said plurality of holes in said second connector through said front ends of said holes and engages a respective one of said conductive rims; and c) a non-conductive switching actuator removably insertable in one of said plurality of holes through said rear end of said hole to selectively disengage one of said tapered contact areas from a respective conductive rim, wherein
each of said holes has a second conductive rim on said rear end thereof and each conductive rim is electrically coupled with a corresponding second conductive rim, and said non-conductive switching actuator is provided with a conductive base for contacting said second conductive rim.

16. A connector system according to claim 15, wherein:

said non-conductive switching actuator comprises a conductive conical base with a non-conductive apex extension.

17. A connector system according to claim 16, wherein:

said apex extension is cylindrical.

* * * * *